(12) United States Patent
Balakrishnan et al.

(10) Patent No.: US 9,691,715 B2
(45) Date of Patent: Jun. 27, 2017

(54) SUPPORT FOR LONG CHANNEL LENGTH NANOWIRE TRANSISTORS

(71) Applicant: INTERNATIONAL BUSINESS MACHINES CORPORATION, Armonk, NY (US)

(72) Inventors: Karthik Balakrishnan, White Plains, NY (US); Isaac Lauer, Yorktown Heights, NY (US); Tenko Yamashita, Schenectady, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/093,350

(22) Filed: Apr. 7, 2016

(65) Prior Publication Data
US 2017/0018608 A1    Jan. 19, 2017

Related U.S. Application Data

(62) Division of application No. 14/798,007, filed on Jul. 13, 2015.

(51) Int. Cl.
*H01L 21/02* (2006.01)
*H01L 23/00* (2006.01)
(Continued)

(52) U.S. Cl.
CPC ...... *H01L 23/562* (2013.01); *H01L 21/02603* (2013.01); *H01L 29/0669* (2013.01); *H01L 29/0673* (2013.01); *H01L 29/42392* (2013.01); *H01L 29/66439* (2013.01); *H01L 29/66477* (2013.01); *H01L 29/775* (2013.01); *H01L 29/78696* (2013.01)

(58) Field of Classification Search
CPC ........... H01L 29/0673; H01L 29/66477; H01L 29/42392; H01L 29/78696; H01L 29/0669; H01L 23/562; H01L 51/4266; H01L 21/02603
See application file for complete search history.

(56) References Cited

U.S. PATENT DOCUMENTS 8,058,089 B2   11/2011   Segal et al.
8,557,613 B2   10/2013   Shearn et al.
(Continued)

FOREIGN PATENT DOCUMENTS

CN   103779182 A   5/2014
FR   2995691 A1    3/2014
(Continued)

OTHER PUBLICATIONS

List of IBM Patents or Patent Applications Treated as Related dated Apr. 7, 2016, 2 pages.

*Primary Examiner* — Galina Yushina
(74) *Attorney, Agent, or Firm* — Tutunjian & Bitetto, P.C.; Vazken Alexanian

(57) ABSTRACT

A nanowire device includes a first component formed on a substrate and a second component disposed apart from the first component on the substrate. A nanowire is configured to connect the first component to the second component. An anchor pad is formed along a span of the nanowire and configured to support the nanowire along the span to prevent sagging.

19 Claims, 4 Drawing Sheets

(51) Int. Cl.
*H01L 29/775* (2006.01)
*H01L 29/423* (2006.01)
*H01L 29/786* (2006.01)
*H01L 29/06* (2006.01)
*H01L 29/66* (2006.01)

(56) References Cited

U.S. PATENT DOCUMENTS

| | | | |
|---|---|---|---|
| 8,889,564 B2 | 11/2014 | Cheng et al. | |
| 2002/0064892 A1* | 5/2002 | Lepert | G06K 9/00053 438/5 |
| 2006/0151844 A1* | 7/2006 | Avouris | B82Y 10/00 257/411 |
| 2009/0230380 A1 | 9/2009 | Leon et al. | |
| 2011/0095267 A1* | 4/2011 | Bryant | B82Y 10/00 257/24 |
| 2012/0068150 A1* | 3/2012 | Bangsaruntip | B82Y 10/00 257/9 |
| 2013/0026451 A1* | 1/2013 | Bangsaruntip | H01L 27/1211 257/24 |
| 2013/0207079 A1* | 8/2013 | Sleight | H01L 29/775 257/24 |
| 2013/0307513 A1* | 11/2013 | Then | H01L 29/66469 323/311 |
| 2015/0021691 A1 | 1/2015 | Akarvardar et al. | |
| 2015/0041897 A1 | 2/2015 | Basker et al. | |
| 2015/0356223 A1* | 12/2015 | Balakrishnan | G06F 17/5068 716/55 |
| 2016/0056304 A1* | 2/2016 | Kim | H01L 29/66439 257/192 |

FOREIGN PATENT DOCUMENTS

| | | | | |
|---|---|---|---|---|
| FR | 2995691 B1 | 10/2014 | | |
| WO | WO2014142910 A1 | 9/2014 | | |
| WO | WO 2014/169242 | * 10/2014 | | B82B 1/00 |

* cited by examiner

SUPPORT FOR LONG CHANNEL LENGTH NANOWIRE TRANSISTORS

BACKGROUND

Technical Field

The present invention relates to semiconductor devices, and more particularly to nanowire devices having a long channel length with reduced sagging.

Description of the Related Art

Nanowire field effect transistors (FETs) may be employed for a number of applications. Nanowire FETs may be subject to physical degradation due to mechanical changes, such as sagging. Specifically, in gate all-around structures, long channel devices include long unsupported spans that tend to sag or otherwise deflect either immediately or over time. This deflection can cause the nanowire to touch the substrate or other components, resulting in an undesired result or short. Long lengths of nanowire can cause mechanical sagging and therefore a lack of structural integrity.

SUMMARY

A nanowire device includes a first component formed on a substrate and a second component disposed apart from the first component on the substrate. A nanowire is configured to connect the first component to the second component. An anchor pad is formed along a span of the nanowire and configured to support the nanowire along the span to prevent sagging.

Another nanowire device includes a source and a drain formed on a substrate and separated by a span. At least one nanowire is suspended over the substrate and is configured to connect the source and the drain as a device channel. A gate dielectric and a gate metal are formed around the at least one nanowire. An anchor pad is formed along the span and configured to support the at least one nanowire along the span to prevent sagging.

A method for supporting a nanowire device channel includes connecting a source to a drain using at least one nanowire as a device channel; and supporting the at least one nanowire with an anchor pad formed along a span of the at least one nanowire and configured to support the at least one nanowire along the span to prevent sagging.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
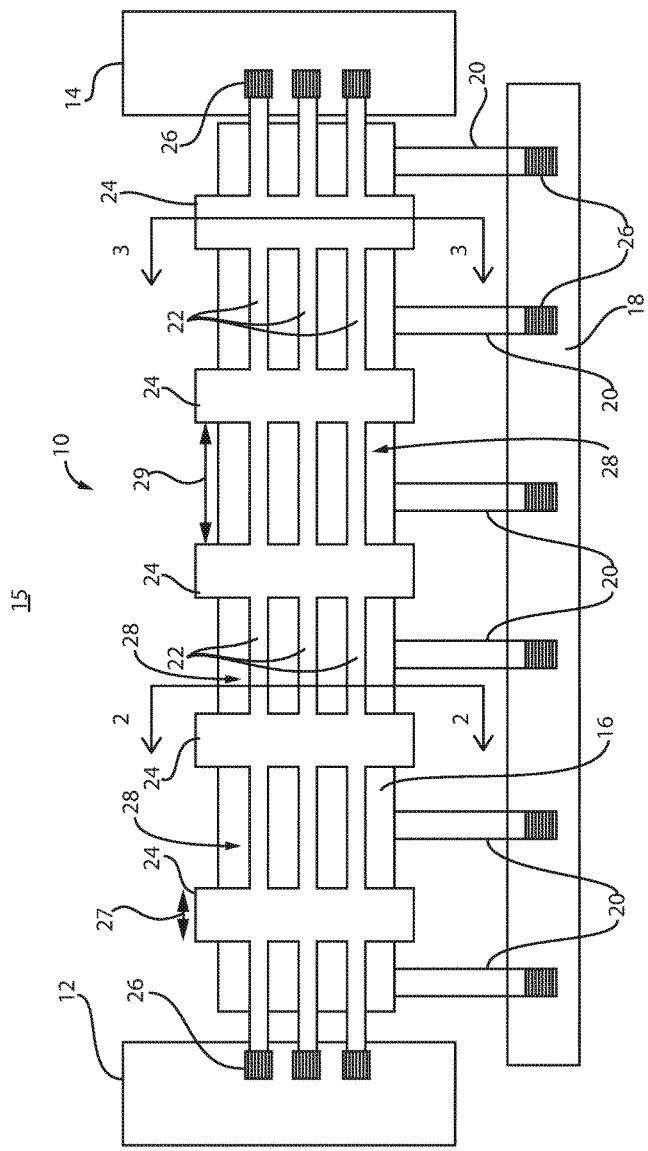
FIG. 1 is a partial top view of a semiconductor device showing a nanowire device channel being supported by anchor pads between two components (e.g., a source region and a drain region of the semiconductor device) in accordance with the present principles.

In accordance with the present principles, nanowires and methods for formation of nanowires are provided. The nanowires include anchor pads disposed between sections or segments of nanowires to prevent nanowire sagging. The anchor pads may vary in size and number, and may be placed at different distances along the nanowire(s). The anchor pads are preferably integrally formed with the nanowires, and preferably include the same materials and are formed in a same formation process. True nanowire current can be computed by subtracting out the influences of the anchor pads based pad width(s) of the anchor pads to extract current as though the anchor pads were not present.

The nanowires described herein include gate all-around nanowires. It should be understood that the nanowires may have other structures and configurations. For example, the nanowires may be included as a device channel for a nanowire transistor but may also be employed as conductive lines. In addition, the nanowires may include a number of different shaped cross-sections, for example, square or rectangular shapes as well as the circular or round shapes as described herein. The overall length of the nanowire or cumulative segments of the nanowires is determined in accordance with a particular application, and in accordance with the present principles is no longer limited by limitations arising from unsupported length on the nanowires.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InGaAs or SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partial top view of a semiconductor device including nanowire field effect transistors (FETs) 10 is illustratively shown. The FET 10 is formed on a substrate 15, which may include dielectric layers, other FETs, conductors and other structures for the semiconductor device. The substrate 15 may include a monocrystalline substrate and may include a bulk substrate or a semiconductor-on-insulator substrate. The substrate may include any suitable substrate material, such as, e.g., Si, SiGe, SiC, Ge, III-V materials, etc.

The FET 10 includes a source 12, a drain 14 and a composite gate structure/region 16. The composite gate structure 16 is a region that is schematically depicted to show a spatial relationship with the other components. The composite gate structure 16 represents gate dielectric and gate metal as will be described with reference to FIG. 2. The box 16 depicted in FIG. 1 represents any suitable gate structure, such as, e.g., a gate all-around structure, a gate layer or plate above or below the nanowires 22, etc.

In a gate all-around structure, the gate dielectric and gate metal are formed annularly or otherwise encapsulating the nanowires 22. In other embodiments, the gate metal or conductor may include a plate in proximity of the nanowires 22 with or without a dielectric layer disposed between the nanowires 22 and the gate metal or conductor.

The gate region 16 connects to a gate line 18 by conductive lines 20. The nanowires 22 are suspended over the substrate 15 on which the device 10 is formed. The substrate 15 may include a semiconductor substrate, such as Si, although other materials may be employed, e.g., glass, quartz, ceramic, etc. Other layers (32, FIG. 2) may be provided between the substrate 15 and the nanowires 22. The conductive lines 20 may be connected to the gate line 18 by vias 26. In addition the nanowires 22 may be connected to the source 12 and the drain using vias 26. It should be understood that other multiple layer configurations and structures may be employed in addition to or instead of the structures illustratively shown.

The source 12 and drain 14 may have their positions interchanged. The source 12 and drain 14 may include doped semiconductor regions, conductive metals, or any other conducting components.

Nanowires 22 described herein refer to material forming a device channel. Nanowires 22 form the device channel for the FET 10. The nanowires 22 may include a diameter or width of between about 5 nm and about 100 nm.

Being the device charnel, the nanowires 22 provide a channel length for the device 10. The channel length is a distance between the source 12 and drain 14. The channel length includes nanowire segments 28 and pad widths 27 of anchor pads 24. In accordance with the present principles, the anchor pads 24 provide support for the nanowire segments 28 and prevent mechanical sagging. The nanowire segments 28 include a nanowire segment length 29, which may be the same for all segments of the device 10 or groups of segments may have different nanowire segment lengths 29 for different portions of the device 10.

It should be understood that FIG. 1 illustratively depicts three nanowires 22 connecting two components 12, 14. However, one or more (e.g., greater than three) nanowires 22 may be employed. In addition the source 12 and drain 14 may include other components or structures, e.g., nodes connecting to passive elements (e.g., capacitors, etc.) or other active components (e.g., diodes, etc.).

Figure 2:
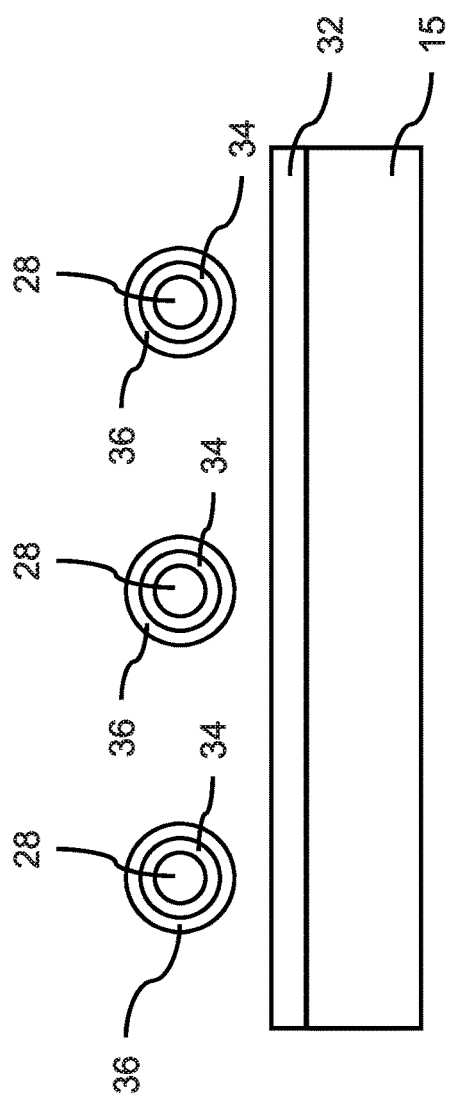
FIG. 2 is a cross-sectional view taken at section line 2-2 of FIG. 1 showing the nanowires having a gate all-around structure in accordance with on embodiment in accordance with the present principles.

Referring to FIG. 2 with continued reference to FIG. 1, the nanowires 22 include an appropriately doped semiconducting material, for example, Si, SiGe, Ge, a III-V semiconductor, such as, e.g., GaAs or InGaAs. FIG. 2 shows a cross-section taken at section line 2-2 in FIG. 1. The nanowire segments 28 are surrounded by dielectric material 34 (e.g., a high-K dielectric material) and a metal gate material 36. If a high-k dielectric material is employed, the high-K dielectric material 34 may include, e.g., hafnium oxide, although other materials may be employed. The metal gate material 36 may include, e.g., tungsten, although other gate materials may be employed. The metal gate material 36 is represented as part of the composite gate region 16 in FIG. 1. The metal gate material 36 connects to the conductive lines 20 through, e.g., vias or other connections (not shown). In other embodiments, the metal gate material 36 may include another dielectric material (not shown) formed on it.

In particularly useful embodiments, the nanowire segments 28 may include a nanowire segment length 29 of between about 50 nm to about 300 nm and preferably between about 100 nm to about 200 nm. The overall channel length including the widths of the anchor pads 24 and of all the nanowire segments 28 may be between about 500 nm to about 2 microns. It should be understood that while the FIGS. show three nanowires 22, the present principles are applicable to devices with a single nanowire or multiple parallel nanowires.

Figure 3:
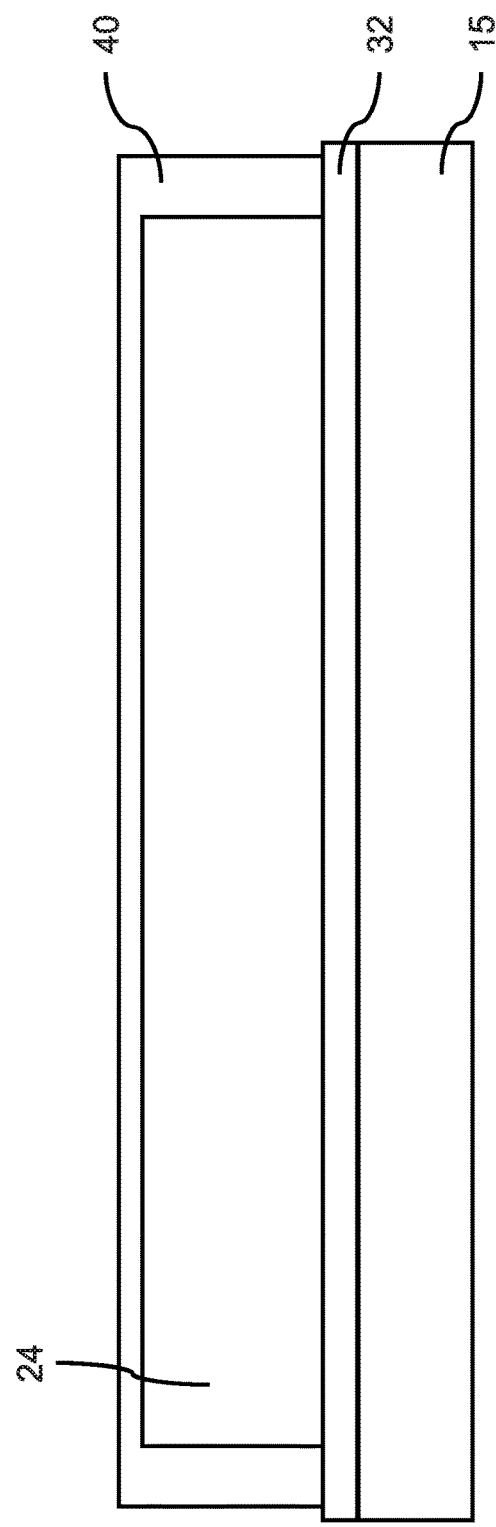
FIG. 3 is a cross-sectional view taken at section line 3-3 of FIG. 1 showing anchor pads anchored to a dielectric layer formed on a substrate in accordance with one illustrative embodiment in accordance with the present principles.

Referring to FIG. 3, with continued reference to FIG. 1, FIG. 3 shows a cross-section taken at section line 3-3 in FIG. 1. The nanowires 22 are mounted to the anchor pads 24 in a periodic manner. The anchor pads 24 are anchored to the substrate 15 or layers 32 formed on the substrate 15. The anchor pads 24 are depicted as rectangular; however, it should be understood that the anchor pads 24 may include any shape, e.g., oval, round, polygonal, etc. The anchor pads 24 are preferably integrally formed with the nanowires 22, and are composed of a same material and are formed at the same time.

A dielectric layer 40 or protective layer may be formed over the anchor pads 24. The dielectric layer 40 may include an oxide, a nitride or other suitable material.

In such a case, the anchor pads 24 may need to be exposed to a voltage to enable conduction. A gate plate may be employed to provide this (e.g., gate region 16, FIG. 1). In this way, a gate metal may be formed corresponding to a shape of the anchor pad 24 or may include the entire region 16. The gate metal may be formed over or under the anchor pad 24 with a gate dielectric formed therebetween. Alternatively, the larger area provided by the anchor pads 24 may provide sufficient conduction without the need for gate activation for conduction. Narrow geometry of the nanowire 22 contrasts with the wide geometry of the anchor pads 24 and is what causes the nanowire 22 to become suspended, while the anchor pad 24 remains anchored (i.e., does not become suspended).

The anchor pads 24 enable long gate length devices using nanowires 22. In the conventional art, the long nanowires (which are required to create long channel transistors) tend to sag, which compromises the structural integrity of the nanowire and thus negatively affects transistor performance. In accordance with the present principles, long nanowires 22 made even longer using anchor pads 24. The nanowire segments 28 are periodically anchored to the substrate 15 along the length of the channel by anchor pads 24. This preserves the structural integrity of the nanowires 22 by preventing sagging.

In particularly useful embodiments, the anchor pads 24 may include a pad width of between about 20 nm to about 50 nm. The thickness of the anchor pads 24 may be between about 50 nm to about 500 nm. The anchor pads 24 may include a thickness of between two to five times the diameter/thickness of the nanowires 22. The anchor pads 24 may be periodically provided after a nanowire segment length of about 200 nm, although anchors shapes 24 may be placed after segment lengths having other dimensions.

The nanowires 22 and anchor pads 24 can be formed using lithographic processing. This includes nanowire and pad patterning and lithography using a photolithography mask, followed by a nanowire and pad etch using a reactive ion etch (RIE) or other etch process. Next, a nanowire release etch is performed using another etch process to free the nanowire segments 28 from the substrate 15. After this, a gate-first or replacement metal gate processing continues as is known in the art.

Figure 4:
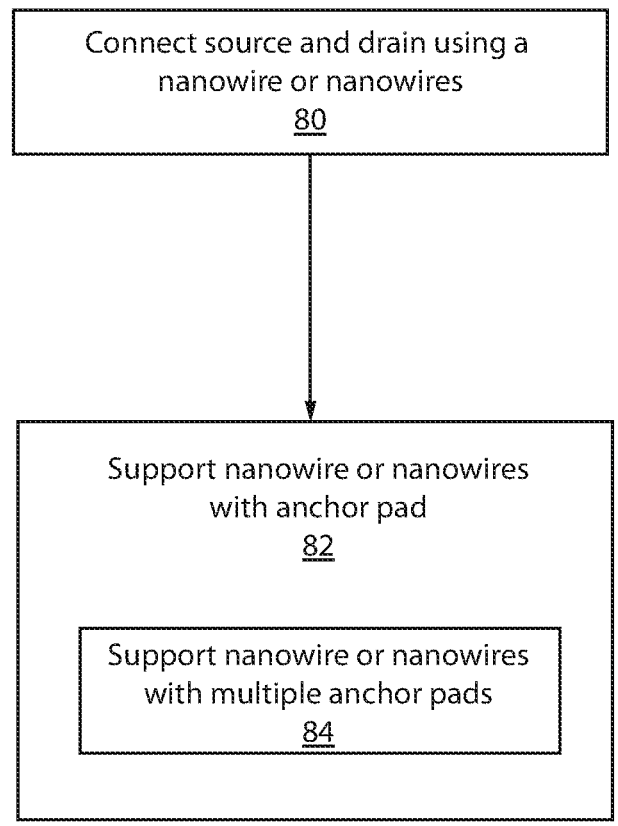
FIG. 4 is a block/flow diagram showing a method for supporting nanowires in accordance with one illustrative embodiment.

Referring to FIG. 4, a method for supporting a nanowire device channel is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be further noted that the processing needed to form the nanowire transistor devices in accordance with the present principles may include known semiconductor processing techniques. For example, the source and drain regions may be formed by doping areas of a substrate, or epitaxially growing (and doping) areas of the substrate to form source and drain regions. In addition, patterned etching may be employed to form the nanowires and the anchor pads. Deposition and patterning may be employed to form metal connection and dielectric layers, as needed.

In block 80, a source is connected to a drain using at least one nanowire as a device channel. This may be performed using connection structures, such as vias or contacts. In block 82, the at least one nanowire is supported by an anchor pad formed along a span of the at least one nanowire and configured to support the at least one nanowire along the span to prevent sagging.

In one embodiment, the nanowire, including, nanowire segments 28, and the anchor pads 24, may be grown or deposited on the substrate (or other layers). A first etch shapes (or patterns) the anchor pads and the nanowires, then the anchor pads are covered and a second etch etches the nanowires to further reduce the nanowires and remove contact with the substrate. This causes the nanowires to be suspended. In accordance with the present principles the nanowires are suspended between the anchor pads.

In block 84, the at least one nanowire may be supported with a plurality of anchor pads disposed along the span. The anchor pads may be intermittently or periodically located along the span. The periods may be equal (divided evenly over the overall length) or may be different as needed.

Figure 5:
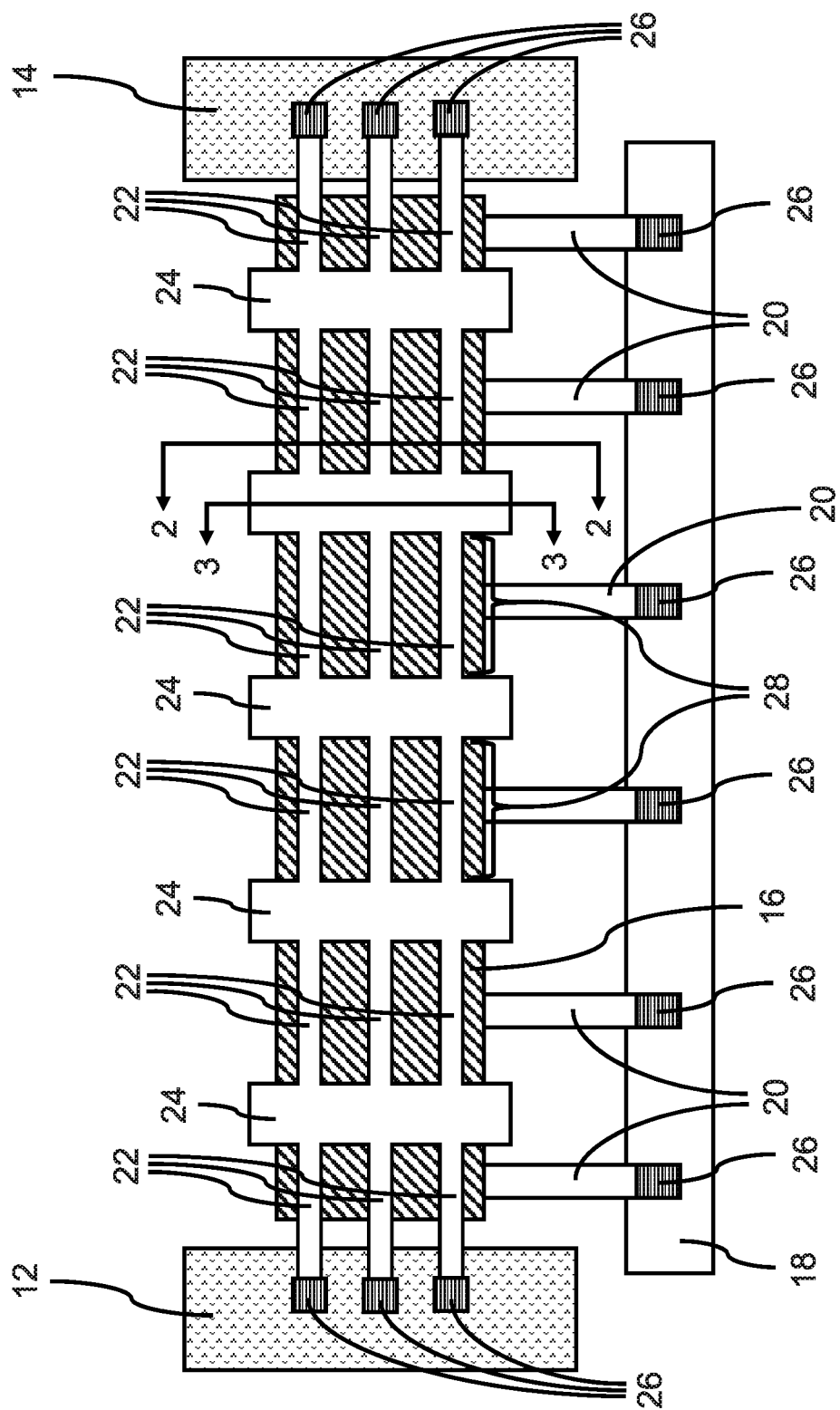
FIG. 5 is a partial top view of a semiconductor device showing a nanowire device channel having a nanowire including nanowire segments and being supported by anchor pads between two regions (e.g., a source region and a drain region of the semiconductor device), in accordance with the present principles.

FIG. 5 is a partial top view of a semiconductor device showing a nanowire device channel having nanowire including nanowire segments and being supported by anchor pads between two regions (e.g., a source region and a drain region of the semiconductor device), as described for FIG. 1, in accordance with the present principles.

Having described preferred embodiments for support for long channel length nanowire transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for supporting a nanowire device channel, comprising:
   connecting a source to a drain using at least one nanowire as a device channel, wherein the at least one nanowire includes nanowire segments having, a length in the range of about 50 nm to about 300 nm; and
   supporting the at least one nanowire with an anchor pad formed along a span of the at least one nanowire and configured to support the at least one nanowire along the span to prevent sagging.

2. The method as recited in claim 1, wherein supporting the at least one nanowire with an anchor pad includes supporting the at least one nanowire with a plurality of anchor pads disposed along the span.

3. The method of claim 1, wherein the nanowire segments are suspended over a substrate on which the source and drain are formed.

4. The method of claim 1, further comprising forming a dielectric layer over the anchor pad.

5. The method of claim 2, wherein the at least one nanowire includes a plurality of nanowire segments connected by a plurality of anchor pads, wherein the plurality of anchor pads are disposed along the span with a periodicity of about 200 nm and the nanowire segments have a le of about 200 nm.

6. The method of claim 1, wherein the at least one nanowire is formed by a lithographic process including patterning, and a release etch, that frees the nanowire segments of the at least one nanowire from the substrate.

7. The method of claim 1, wherein the device channel has a length in the range of about 500 nm to 2 microns.

8. The method of claim 7, wherein a plurality of nanowires connect the source to the drain.

9. The method of claim 7, wherein a plurality of anchor pads support the at least one nanowire, and the plurality of anchor pads are disposed along the device channel with a periodicity equal to the nanowire segments length, such that each of the nanowire segments is supported by at least one anchor pad.

10. A method of forming a nanowire device, comprising:
    forming at least one nanowire, including a plurality of anchor pads along a span of the at least one nanowire, and a plurality of nanowire segments having a length in the range of about 50 nm to about 300 nm, where the at least one nanowire is configured to connect a first region to a second region, and where the plurality of anchor pads are placed intermittently between the first region and second region and are configured to support the plurality of nanowire segments along the span to prevent sagging of the at least one nanowire between first region and second region.

11. The method of claim 10, wherein at least a first anchor pad has a first dimension having a first size and at least a second anchor pad has a first dimension having a second size different than the first dimension size.

12. The method of claim 10, wherein a plurality of nanowires connects the first region to the second region, and at least one of the plurality of nanowire segments has a first length different from a second length of another nanowire segment.

13. The method of claim 12, wherein at least one of the anchor pads is placed a first distance from the first region or the second region equal to the first length of the at least one of the plurality of nanowire segments.

14. The method of claim 12, wherein the plurality of nanowire segments has a square cross-section.

15. The method of claim 12, wherein each of the plurality of nanowire segments is surrounded by a high-K dielectric material.

16. A method of forming a nanowire device, comprising:
    forming a source and a drain on a substrate, where the source and drain are separated by a span;
    forming at least one nanowire configured to connect the source and the drain as a device channel, wherein the at least one nanowire is connected to the source or drain by a via, and the at least one nanowire includes an anchor pad along the span that is configured to support the at least one nanowire along the span to prevent sagging, and wherein the at least one nanowire-includes nanowire segments having a length in the range of about 50 nm to about 300 nm.

17. The method of claim 16, wherein the the at least one nanowire includes nanowire segments that have a circular cross-section with a diameter between about 5 nm and about 100 nm.

18. The method of claim 16, wherein a thickness of the anchor pad is in the range of about 50 nm to about 500 nm.

19. The method of claim 16, wherein the anchor pad has a width in the range of about 20 nm to about 50 nm.

* * * * *